United States Patent
Lee et al.

(10) Patent No.: US 10,037,816 B2
(45) Date of Patent: Jul. 31, 2018

(54) MEMORY CONTROLLER, MEMORY SYSTEM INCLUDING THE SAME AND OPERATING METHOD THEREOF

(71) Applicant: SK hynix Inc., Icheon-si, Gyeonggi-do (KR)

(72) Inventors: Sung-Eun Lee, Icheon-si (KR); Jung-Hyun Kwon, Seoul (KR); Sang-Gu Jo, Bucheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/647,987

(22) Filed: Jul. 12, 2017

(65) Prior Publication Data

US 2018/0174662 A1    Jun. 21, 2018

(30) Foreign Application Priority Data

Dec. 20, 2016  (KR) ................ 10-2016-0174621

(51) Int. Cl.
| | | |
|---|---|---|
| *G11C 7/00* | (2006.01) | |
| *G11C 29/04* | (2006.01) | |
| *G06F 11/10* | (2006.01) | |
| *H03M 13/09* | (2006.01) | |

(52) U.S. Cl.
CPC .............. *G11C 29/04* (2013.01); *G06F 11/10* (2013.01); *H03M 13/098* (2013.01)

(58) Field of Classification Search
CPC ......... G11C 7/22; G11C 7/072; G11C 7/1006; G11C 7/1051; G11C 7/1078
USPC .................. 365/189.14, 189.07, 189.09
See application file for complete search history.

(56) References Cited

U.S. PATENT DOCUMENTS

2006/0282747 A1* 12/2006 Hummler ............... G11C 29/02
714/763

FOREIGN PATENT DOCUMENTS

| KR | 1020130005499 A | 1/2013 |
|---|---|---|
| KR | 1020140012078 A | 1/2014 |

* cited by examiner

*Primary Examiner* — Son Dinh
(74) *Attorney, Agent, or Firm* — William Park & Associates Ltd.

(57) ABSTRACT

A memory controller may include a detector configured for checking whether the number of bits having a first state among a plurality of bits constituting write data is less than a reference value. The memory controller may include an inverter configured for inverting/non-inverting the write data according to the check result of the detector. The detector may generate an error detection signal based on whether or not the number of bits having the first state among a plurality of bits constituting read data is equal to or more than the reference value.

18 Claims, 5 Drawing Sheets

MEMORY CONTROLLER, MEMORY SYSTEM INCLUDING THE SAME AND OPERATING METHOD THEREOF

CROSS-REFERENCE TO RELATED APPLICATIONS

The present application claims priority of Korean Patent Application No. 10-2016-0174621, filed on Dec. 20, 2016, which is incorporated herein by reference in its entirety.

BACKGROUND

1. Technical Field

Examples of embodiments of the present disclosure may generally relate to a memory system including a memory controller, and more particularly, to a memory system relating to detection, and an operating method thereof.

2. Related Art

A memory system is applied to various electronic devices for consumers or industries, for example, computers, mobile phones, PDA (Portable Digital Assistants), digital cameras, game machines, navigation systems and the like, and used as a main storage device or auxiliary storage device. Memory devices constructing a memory system may be roughly divided into volatile memory devices such as DRAM (Dynamic Random Access Memory) and SRAM (Static RAM) and nonvolatile memory devices such as ROM (Read Only Memory), MROM (Mask ROM), PROM (Programmable ROM), EPROM (Erasable Programmable ROM), EEPROM (Electrically Erasable Programmable ROM), FRAM (Ferroelectric RAM), PRAM (Phase-change RAM), MRAM (Magnetoresistive RAM), RRAM (Resistive RAM) and flash memory.

The volatile memory device has high write and read speeds, but loses data stored therein when a power supply is stopped. On the other hand, the nonvolatile memory device has relatively low write and read speeds, but retains data stored therein even though a power supply is stopped. Therefore, the nonvolatile memory device is used in order to store data which must be retained regardless of whether power is supplied.

The PRAM which is one of the nonvolatile memory devices may include memory cells formed of a phase-change material, and store data using the characteristic that the state of the phase-change material is changed according to a current thereto. That is, the phase-change material may have a crystalline phase or amorphous phase depending on the current applied thereto, and the memory cells may store data using the characteristic that the phase-change material in the crystalline state has different resistance from the phase-change material in the amorphous phase. The PRAM has a data processing speed corresponding to the speed of a volatile RAM, and retains data stored therein even when power is cut off.

FIGS. 1A and 1B are diagrams for describing a write operation of storing data in one memory cell of PRAM.

When a low current equal to or less than a threshold value is applied to a memory cell 100 embodied by a phase change resistor as illustrated in FIG. 1A, the temperature of the phase change resistor becomes appropriate for crystallization. Thus, the memory cell 100 is changed into the crystalline phase and becomes a low-resistance material.

On the other hand, when a high current more than the threshold value is applied to the memory cell 100 as illustrated in FIG. 1B, the temperature of the phase change resistor reaches a temperature equal to or more than a melting point. Thus, the memory cell 100 is changed into the amorphous phase, and becomes a high-resistance material.

As such, the memory cell 100 constituting the PRAM has two kinds of states, that is, the crystalline state and the amorphous state, depending on write operations. The crystalline state may indicate a logic value '0' (Logical 0) of data because the resistance has a relatively low magnitude, and the amorphous state may indicate a logic value '1' (Logical 1) of data because the resistance has a relatively high magnitude. A write operation of changing the data of the memory cell 100 from the logical value '0' to the logical value '1' may be referred to as RESET operation, and a write operation of changing the data of the memory cell 100 from the logical value '1' to the logical value '0' may be referred to as SET operation.

FIG. 2 is a graph illustrating current pulses for the write operations of the PRAM illustrated in FIGS. 1A and 1B. For reference, FIG. 2 also illustrates a current for a read operation of the PRAM, for comparison therebetween.

As described above, the write operation may include the RESET and SET operations. Since both of the RESET and SET operations are operations for writing data to a memory cell, the RESET and SET operations change the state of the phase change material. Therefore, as illustrated in FIG. 1, the RESET and SET operations may require a large amount of current, and increase latency (refer to RESET and SET pulses). On the other hand, the read operation is an operation for sensing only the current state of the phase change material. Therefore, the value of the phase change material can be read through a low current and low latency (refer to READ pulse).

In particular, although both of the RESET and SET operations are write operations, the magnitude of the current pulse and the latency which are used in the RESET operation are different from those used in the SET operation. Thus, power consumed for the RESET operation may be different from power consumed for the SET operation. That is, the operation of writing data of the logical value '1' to a memory cell may have different power consumption from the operation of writing data of the logical value '0' to a memory cell.

SUMMARY

Various embodiments are directed to a memory system which detects an error in data read from a memory device based on the logical bit distribution of the data, and an operating method thereof.

In accordance with an embodiment, a memory controller may include a detector configured for checking whether the number of bits having a first state among a plurality of bits constituting write data is less than a reference value, and an inverter configured for inverting or non-inverting (inverting/non-inverting) the write data according to the check result of the detector, wherein the detector may generate an error detection signal based on whether or not the number of bits having the first state among a plurality of bits constituting read data is equal to or more than the reference value.

In accordance with an embodiment, a memory system may include a memory device comprising a plurality of memory cells for storing data having a first or second state, and a memory controller configured for writing or reading (writing/reading) a preset length of write or read (write/read) data to or from (to/from) the memory device, wherein the memory controller inverts or non-inverts (inverts/non-inverts) the write data such that less than half of the inverted or non-inverted (inverted/non-inverted) data has the first state, and generates an error detection signal based on whether or not equal to or more than half of the read data has the first state.

In accordance with an embodiment, an operating method of a memory system may include checking whether the number of bits having a first state among a plurality of bits constituting write data is less than a reference value, inverting or non-inverting the write data according to the check result, storing the inverted or non-inverted data with flag information in a memory device, the flag information indicating whether the write data is inverted or non-inverted, and generating an error detection signal based on whether or not the number of bits having the first state among a plurality of bits constituting read data obtained by reading the stored data is equal to or more than the reference value.

DETAILED DESCRIPTION

Figure 1A:
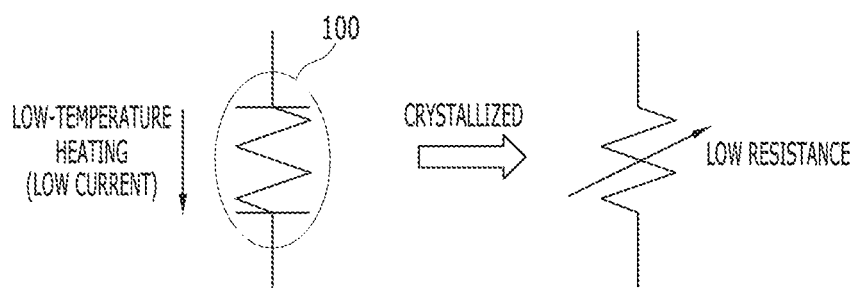
FIGS. 1A and 1B are diagrams for describing a write operation of storing data in one memory cell of PRAM.
Figure 1B:
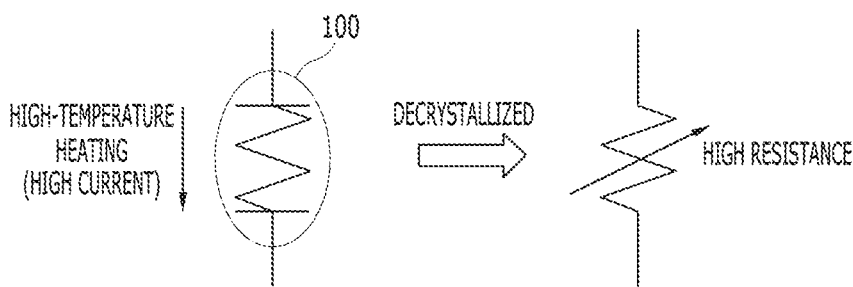
Figure 2:
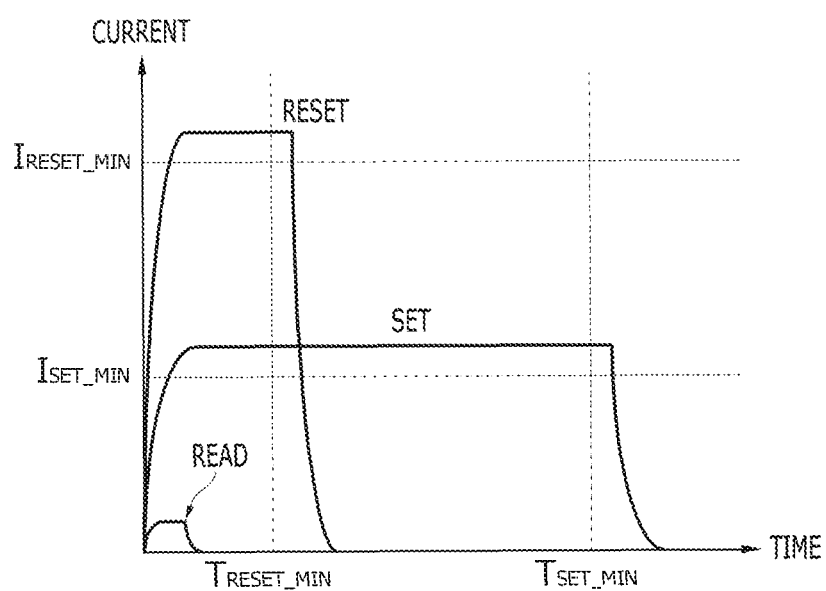
FIG. 2 is a graph illustrating current pulses for the write operation of the PRAM illustrated in FIGS. 1A and 1B.

Various embodiments will be described below with reference to the accompanying drawings. The present disclosure may, however, be embodied in different forms and should not be construed as limited to the embodiments set forth herein. Rather, these embodiments are provided so that this disclosure will be thorough and complete, and will fully convey the scope to those skilled in the art. Throughout the disclosure, like reference numerals refer to like parts throughout the various figures and embodiments of the present disclosure.

As mentioned above, power consumed for the RESET operation may be different from power consumed for the SET operation. That is, the operation of writing data of the logical value '1' to a memory cell may have different power consumption from the operation of writing data of the logical value '0' to a memory cell. As a result, when data stored in a memory cell is inverted/non-inverted to the logic value requiring low power consumption and the inverted/non-inverted data is stored with the information, the power consumption of the write operation of the PRAM can be reduced.

As such, various embodiments may be directed to a memory system which writes data having logical bits with a predetermined distribution to a memory device and reads the data from the memory device while detecting an error in the data based on the logical bit distribution, and an operating method thereof.

Figure 3:
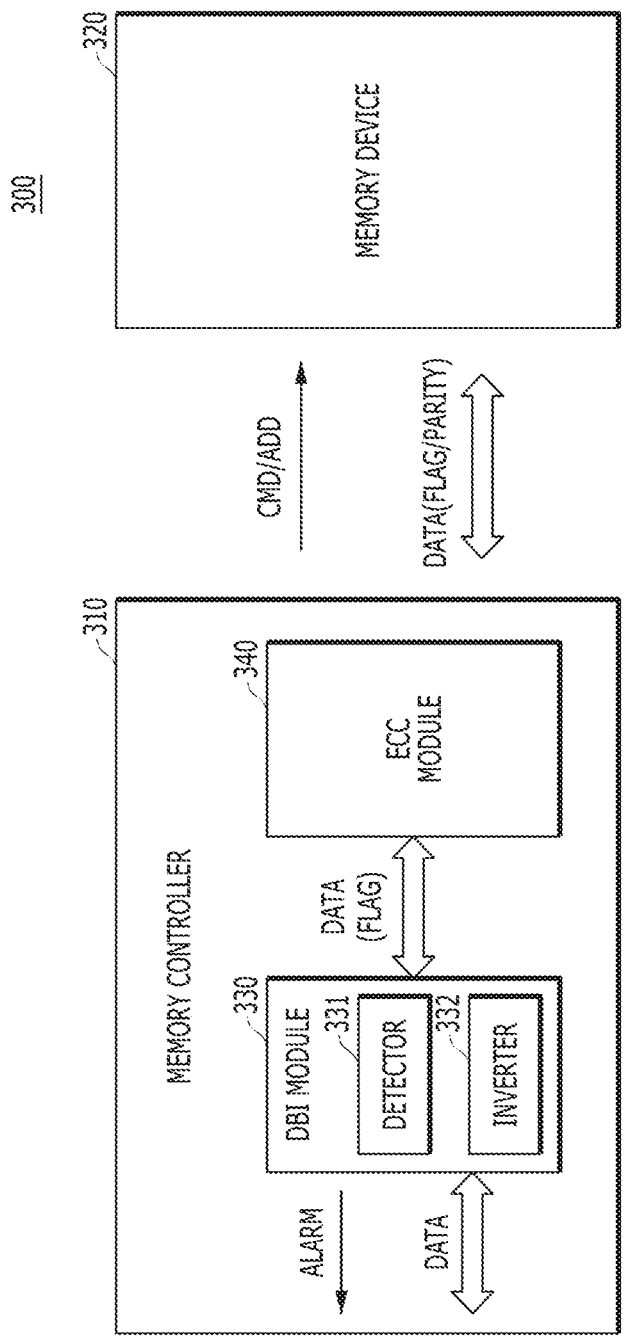
FIG. 3 is a block diagram illustrating a memory system in accordance with an embodiment.

FIG. 3 is a block diagram illustrating a memory system in accordance with an embodiment.

Referring to FIG. 3, the memory system 300 may include a memory controller 310 and a memory device 320.

The memory controller 310 may control an operation of the memory device 320 by applying a command CMD and address ADD to the memory device 320, and exchange data DATA(FLAG/PARITY) with the memory device 320 during a read or write operation. That is, the memory controller 310 may transmit the command CMD to control the read or write operation of the memory device, and transmit the address ADD to select memory cells which are to be read and written in the memory device 320. When controlling the write operation of the memory device 320, the memory controller 310 may also transmit data DATA(FLAG/PARITY) to write to the selected memory cells.

When the memory device 320 is embodied by a PRAM, a plurality of memory cells constituting the memory device 320 may store data having a first state (for example, logic value '1') or a second state (for example, logic value '0'). At this time, an operation of writing the data having the first state to the memory device 320 may have different power consumption from an operation of writing the data having the second state to the memory device 320.

Therefore, while writing and reading (writing/reading) a predetermined unit (length) of data to and from (to/from) the memory device 320, the memory controller 310 may invert or non-invert (invert/non-invert) the written data DATA in such a manner that the number of data having the first state among the written data DATA becomes less than half of the total number of written data DATA. Furthermore, in accordance with a present embodiment, the memory controller 310 may generate an error detection signal ALARM when the number of data having the first state among the read data DATA(FLAG) is equal to or more than half of the total number of read data DATA(FLAG).

For this operation, the memory controller 310 may include a DBI (Data Bus Inversion) module 330. Referring to FIG. 3, the DBI module 330 may include a detector 331 and an inverter 332.

The detector 331 may check whether the number of bits having the first state among a plurality of bits constituting data DATA written to the memory device 320 is less than a reference value. When the number of bits having the first state among the plurality of bits is equal to or more than the reference value, the detector 331 may enable a flag signal. For example, the plurality of bits may have a logical value of '1' or '0'. The detector 331 may count the number of bits having the logical value '1' among the plurality of bits, and enable the flag signal when the count value is equal to or more than half of the total number of bits.

The inverter 332 may invert or not-invert (invert/not-invert) write data DATA according to the check result of the detector 331. When the flag signal is enabled by the detector 331, the inverter 332 may invert the write data DATA. On the other hand, when the flag signal is disabled by the detector 331, the inverter 332 may not invert write data DATA, but just output the write data DATA.

Therefore, when the number of bits having the first state in the write data DATA is equal to or more than half of the total number of bits, the detector 331 may enable the flag signal, and the inverter 332 may invert the write data DATA. As a result, the bits having the second state, of which the number was less than half of the total number of bits, may be inverted to bits having the first state. Thus, the number of bits having the first state in the final output data becomes less than half of the total number of bits.

On the other hand, when the number of bits having the first state in the write data DATA is less than half of the total number of bits, the detector 331 may disable the flag signal, and the inverter 332 may not invert the write data DATA but just output the write data DATA. As a result, the number of bits having the first state in the final output data also becomes less than half of the total number of bits.

The DBI module 330 may output the information on the flag signal generated by the detector 331, that is, flag information FLAG as the final data DATA(FLAG) with the data inverted or not-inverted (inverted/not-inverted) by the inverter 332. That is, the flag information FLAG may indicate whether the write data DATA were inverted or not-inverted (inverted/not-inverted) by the DBI module 330. The number of bits having the first state in the final data DATA(FLAG) may be less than half of the total number of bits. Therefore, the memory controller 310 may invert or not-invert (invert/not-invert) data to be stored in the memory device 320 such that the data have a logical bit distribution which requires low power consumption, and write the inverted/non-inverted data with the flag information, thereby reducing the power consumption of the write operation.

When the characteristics of the plurality of memory cells included in the memory device 320 are degraded, an error may randomly occur in the data stored in the memory device 320. The memory controller 310 may further include an ECC (Error Correction Code) module 340 in order to detect and correct (detect/correct) an error which occurs in the data read from the memory device 320.

The ECC module 340 may generate a parity bit based on a code (for example, BCH code or RS code) which is set for data written to the memory device 320. Information on the generated parity bit, that is, parity information PARITY and the data may be stored in the memory device 320. When the stored data are read, the parity information PARITY may be read together. The ECC module 340 may detect and correct an error which occurred in the read data, based on the read parity information PARITY.

That is, the ECC module 340 may generate the parity information PARITY in order to detect and correct (detect/correct) an error of the output data DATA(FLAG) of the DBI module 330, and provide the data DATA(FLAG) of which the error was detected and corrected through the parity information PARITY, to the DBI module 330. As a result, the ECC module 340 may generate the parity information PARITY in order to detect/correct an error of the write data inverted/non-inverted by the inverter 332, and provide the data of which the error was detected/corrected through the parity information PARITY, as read data.

However, the number of error bits which can be corrected by the ECC module 340 may be limited depending on a code or algorithm applied thereto. That is, when error bits equal to or less than the number of correctable bits among the plurality of bits included in the read data occurred, the ECC module 340 can accurately detect the error bits, and correct the detected error bits. However, when error bits more than the number of correctable bits occurred, the ECC module 340 cannot detect and correct (detect/correct) the error bits. In a severe case, the ECC module 340 may correct even normal bits due to a calculation error, thereby causing an additional error.

In accordance with the present embodiment, the detector 331 of the DBI module 330 may additionally detect an error which occurred in the read data DATA(FLAG). The detector 331 may check whether the number of bits having the first state among a plurality of bits constituting the read data DATA(FLAG) is less than a reference value. For example, when the number of bits having the first state among the plurality of bits constituting the read data DATA(FLAG) is equal to or more than the reference value, the detector 331 may generate an error detection signal ALARM.

The memory controller 310 may output the error detection signal ALARM to a host (not illustrated), such that the host does not use the corresponding data DATA any more. The memory controller 310 may not only additionally detect an error occurrence using the DBI module 330, but also check a mis-correction caused by the ECC module 340. The operation of the memory controller 310 will be described with reference to FIG. 4.

Figure 4:
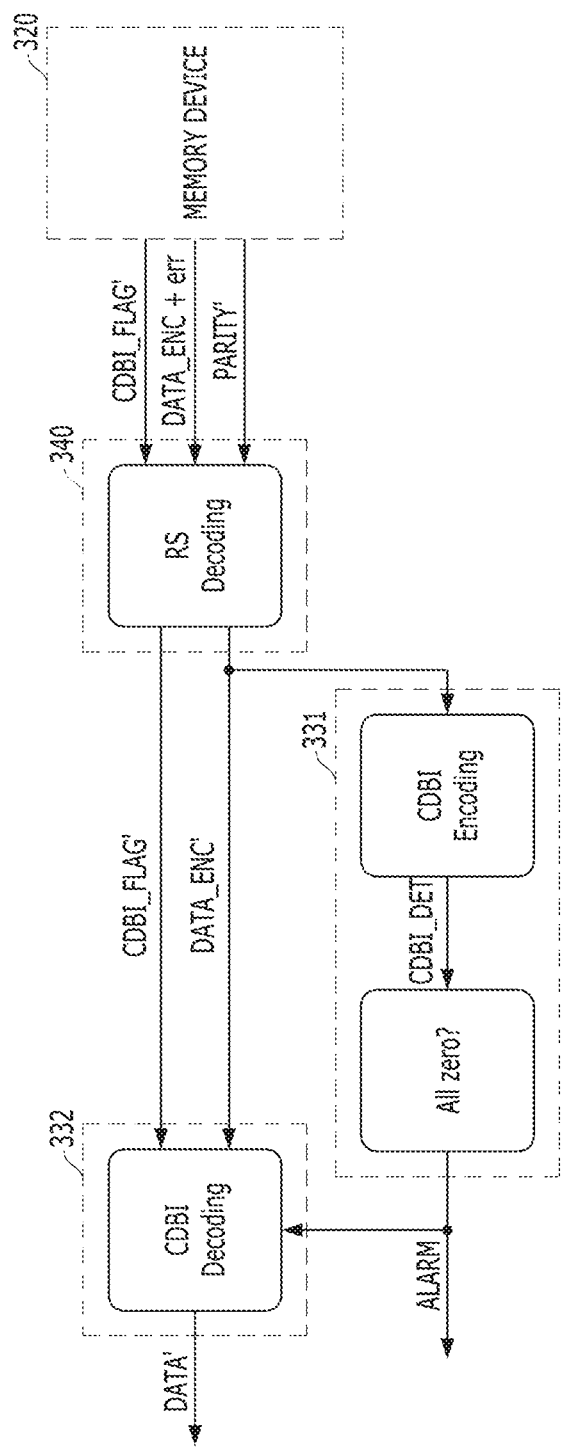
FIG. 4 is a diagram illustrating an operation process of a memory controller illustrated in FIG. 3.

FIG. 4 is a diagram illustrating the operation process of the memory controller 310 illustrated in FIG. 3. In particular, FIG. 4 illustrates the operations of the DIB module 330 and the ECC module 340, which are included in the memory controller 310, during a read operation for data stored in the memory device 320.

Based on data exemplified in Tables 1 and 2 below, the case in which a mis-correction of the ECC module 340 occurred and the case in which a mis-correction of the ECC module 340 does not occur will be comparatively described as follows. Tables 1 and 2 are based on the supposition that the DBI module 330 can generate, for example but not limited to, 4-bit flag information CDBI_FLAG for 64(16*4)-bit data DATA, and the ECC module 340 can correct an error corresponding to a maximum of, for example but not limited to, three bits.

<Table 1 in which mis-correction of ECC module 340 did not occur>

| DATA | 0110110101111111 | 1100011010100000 | 0000101010100011 | 1101101011010100 |
|---|---|---|---|---|
| CDBI_FLAG | 1 | 0 | 0 | 1 |
| DATA_ENC | 1001001010000000 | 1100011010100000 | 0000101010100011 | 0010010100101011 |
| DATA_ENC + err | 1001001010000000 | 1100011010101000 | 0000101010100011 | 0010011100101001 |
| DATA_ENC' | 1001001010000000 | 1100011010100000 | 0000101010100011 | 0010010100101011 |
| CDBI_FLAG' | 1 | 0 | 0 | 1 |
| CDBI_DET | 0 | 0 | 0 | 0 |
| DATA' | 0110110101111111 | 1100011010100000 | 0000101010100011 | 1101101011010100 |
| ALARM | | 0 (no error) | | |

<Table 2 in which mis-correction of ECC module 340 occurred>

| DATA | 0110110101111111 | 1100011010100000 | 000101010100011 | 1101101011010100 |
|---|---|---|---|---|
| CDBI_FLAG | 1 | 0 | 0 | 1 |
| DATA_ENC | 1001001010000000 | 1100011010100000 | 0000101010100011 | 0010010100101011 |
| DATA_ENC + err | 1001001010000001 | 1100011010101000 | 0000101010100011 | 0010011100101001 |

| | | | | |
|---|---|---|---|---|
| DATA_ENC' | 10010010100000<u>1</u> | 111<u>1</u>0110101 0<u>1</u>000 | 0000101010100011 | 001001<u>11</u>001010 0<u>1</u> |
| CDBI_FLAG' | 1 | 0 | 0 | 1 |
| CDBI_DET | 0 | <u>1</u> | 0 | 0 |
| DATA' | 0110110101111 11<u>0</u> | 111<u>1</u>011010101 000 | 0000101010100011 | 110110<u>0</u>011010101 |
| ALARM | | 1 (mis-correction) | | |

First, Table 1 illustrates that first to fourth data DATA, that is, 0110110101111111, 1100011010100000, 0000101010100011 and 1101101011010100 were written according to a request of the host, before a read operation. At this time, when the number of bits having a logic value '1' among the plurality of bits included in the data DATA is equal to or more than half of the total number of bits, the detector 331 of the DBI module 330 may set the flag information CDBI_FLAG to '1'. Therefore, the flag information CDBI_FLAG of the first and fourth data DATA may be set to '1', and only the first and fourth data DATA may be inverted by the inverter 332 of the DBI module 330 such that the inverted/non-inverted final data DATA_ENC are stored in the memory device 320.

Although not illustrated in Table 1, a parity bit may be generated in order to detect/correct an error of the inverted/non-inverted data DATA_ENC through the ECC module 340. That is, the parity information PARITY of the inverted/non-inverted data DATA_ENC may be set and stored in the memory device 320 with the flag information CDBI_FLAG.

Then, when a read request for the first to fourth data DATA is made, the corresponding data DATA_ENC+err, flag information CDBI_FLAG' and parity information PARITY' may be read from the memory device 320. In DATA_ENC+err, "+err" may indicate that an error is likely to occur. Table 1 illustrates that 1-bit and 2-bit errors occurred in the second and fourth data (100011010101000 and 001001110010100<u>1</u>) among the read data DATA_ENC+err.

The ECC module 340 may detect/correct the errors in the read data DATA_ENC+err through a decoding operation RS Decoding based on the parity information PARITY', and output the corrected data DATA_ENC'. Since an error corresponding to a maximum of three bits can be corrected through the ECC module 340, the errors which occurred in the read data DATA_ENC+err can be all corrected, and the corrected data DATA_ENC' can be outputted.

Therefore, the corrected data DATA_ENC' may have the same value as the DATA_ENC inverted/non-inverted by the DBI module 330 during a write operation. As a result, the number of bits having a logic value '1' in the corrected data DATA_ENC' may be less than half of the total number of bits, and the detector 331 may set all the pieces of detection information CDBI_DET to '0' through an encoding operation CDIB Encoding.

Since the detection result of the detector 331 indicates that a mis-correction of the ECC module 340 did not occur, the inverter 332 may decode the flag information CDBI_FLAG' read with the corrected data DATA_ENC', and output the final read data DATA'. Since the DBI module 330 accurately checks whether a mis-correction of the ECC module 340 occurred, the memory controller 310 can provide the same read data DATA' as the write data DATA.

Table 2 also illustrates that first to fourth data DATA, that is, 0110110101111111, 1100011010100000, 0000101010100011 and 1101101011010100 were written according to a request of the host, before a read operation. Therefore, the detector 331 of the DBI module 330 may set the flag information CDBI_FLAG of the first and fourth data DATA to '1', and the inverter 332 of the DBI module 330 may invert only the first and fourth data DATA, such that the inverted/non-inverted final data DATA_ENC can be stored in the memory device 320.

Table 2 illustrates that a mis-correction of the ECC module 340 occurred. That is, Table 2 may illustrate that errors corresponding to bits more than the number of correctable bits occurred in the data DATA_ENC stored in the memory device 320. Therefore, according to a read request for the first to fourth data DATA, errors contained in the data DATA_ENC+err read from the memory device 320 may be checked.

Table 2 illustrates that 1-bit, 1-bit and 2-bit errors occurred in the first, second and fourth data (1001001010000001, 1100011010101000 and 001001 1100101001) among the read data DATA_ENC+err. That is, there occurred errors exceeding a maximum of three bits which can be corrected through the ECC module 340. Therefore, the ECC module 340 cannot normally correct the errors, or cause an additional error.

Referring to the data DATA_ENC' corrected by the ECC module 340, the errors contained in the first and fourth data (001001010000001 and 0010011100101001) were not corrected, and an additional error occurred in the second data (110001101010<u>1</u>000). Therefore, the corrected data DATA_ENC' may have a different value from the DATA_ENC inverted/non-inverted by the DBI module 330 during the write operation. When the inverter 332 inverts/does not invert the corrected data DATA_ENC' based on the flag information CDBI_FLAG', wrong data may be transmitted to the host.

In accordance with a present embodiment, the detector 331 may recheck the logical bit distribution of the data DATA_ENC' corrected by the ECC module 340, and detect an occurrence of mis-correction in the ECC module 340. That is, the detector 331 may check the logical values of the plurality of bits constituting the detected/corrected data DATA_ENC', and set the detection information CDBI_DET to '1' when the number of bits having a logical value '1' is equal to or more than half of the total number of bits.

When any one of all the pieces of detection information CDBI_DET is set to '1', it may indicate that the corrected data DATA_ENC' have a different logical bit distribution from the data DATA_ENC inverted/non-inverted by the DBI module 330 during the write operation. That is, the read data DATA' may differ from the write data DATA due to an error occurrence, and the detector 331 may generate the error detection signal ALARM to notify the mis-correction to the host. Furthermore, the inverter 332 may be enabled in response to the error detection signal ALARM, and invert/not invert the corrected data DATA_ENC', thereby preventing an output of wrong data.

Figure 5:
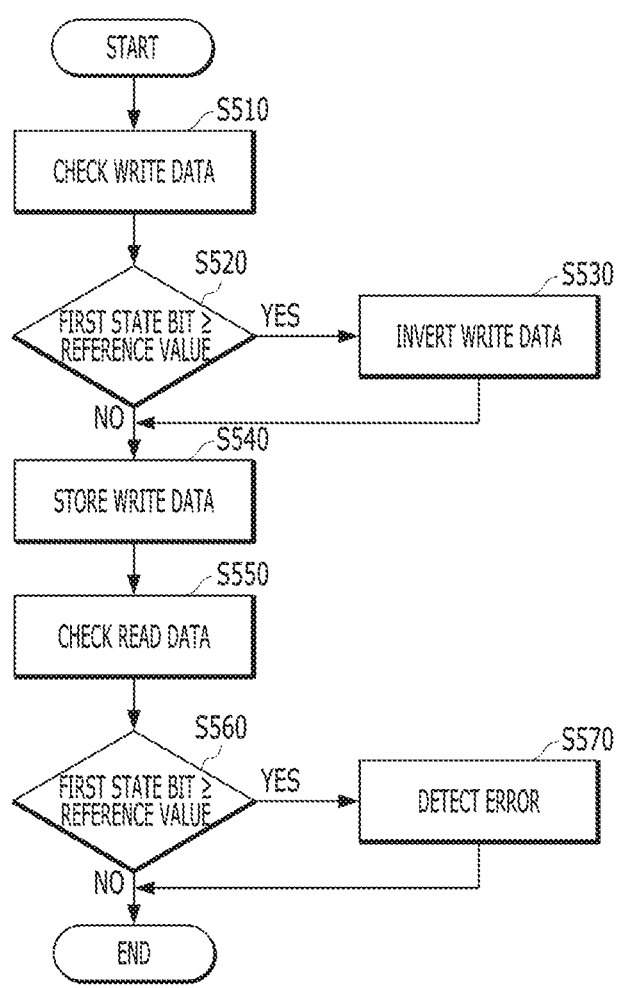
FIG. 5 is a flowchart for describing overall operations of the memory system in accordance with the present embodiments.

FIG. 5 is a flowchart for describing the operation of the memory system in accordance with a present embodiment.

First, according to a write operation of the memory device 320 (refer to FIG. 3), the detector 331 may check whether the number of bits having the first state among a plurality of bits constituting write data DATA is less than a reference value, at step S510. For example, the detector 331 may check whether the number of bits having a logical value '1' in the write data DATA is less than half of the total number of bits.

For this operation, the detector 331 may count the number of bits having the first state among the plurality of bits constituting the write data DATA, and compare the count value to the reference value. When the comparison result indicates that the count value is equal to or more than the reference value, the detector 331 may enable the flag signal.

That is, when the check result of the detector 331 indicates that the number of bits having the first state is equal to or more than the reference value (YES at step S520), the inverter 332 (refer to FIG. 3) may invert the write data DATA at step S530. The inverter 332 may invert or not invert the write data DATA, depending on whether the flag signal generated by the detector 331 is enabled or disabled. The memory controller 310 (refer to FIG. 3) may store the flag information CDBI_FLAG and the inverted or not-inverted data DATA_ENC in the memory device 320, the flag information CDBI_FLAG indicating whether the write data DATA were inverted or not inverted, at step S540.

At this time, the memory controller 310 may include the ECC module 340 (refer to FIG. 3), and generate parity information PARITY in order to detect/correct an error of the inverted or non-inverted data DATA_ENC. The parity information PARITY may also be stored in the memory device 320 with the inverted or not-inverted data DATA_ENC.

Then, according to a read operation of the memory device 320, the detector 331 may check whether the number of bits having the first state among the plurality of bits constituting read data DATA_ENC+err obtained by reading the stored data DATA_ENC is less than the reference value, at step S550. When the number of bits having the first state among the plurality of bits constituting the read data DATA_ENC+err is equal to or more than the reference value (YES at step S560), the detector 331 may generate an error detection signal ALARM at step S570.

Although not illustrated in FIG. 5, flag information CDBI_FLAG' and parity information PARITY' may be read with the read data DATA_ENC+err. The ECC module 340 may detect/correct an error of the read data DATA_ENC+err using the parity information PARITY', and provide the corrected data DATA_ENC' as read data. Thus, the detector 331 may generate an error detection signal ALARM based on the read data DATA_ENC' provided from the ECC module 340. Furthermore, in response to the error detection signal ALARM, the inverter 332 may invert or not invert the read data DATA_ENC' based on the flag information CDBI_FLAG', and output the inverted or not-inverted data to the host.

In accordance with the present embodiments, the memory system may invert/not invert data such that the data have a logical bit distribution requiring low power consumption, in a memory device which has different power consumption depending which logic value is written as data. Therefore, the memory system can reduce power consumption during the whole write operation of the memory device. Furthermore, the memory system can additionally detect an error in the memory device by checking only a state distribution of read data, using the characteristic that the data stored in the memory device have a predetermined logical bit distribution.

Although various embodiments have been described for illustrative purposes, it will be apparent to those skilled in the art that various changes and modifications may be made without departing from the spirit and scope of the disclosure as defined in the following claims.

What is claimed is:
1. A memory controller comprising:
a detector configured for checking whether the number of bits having a first state among a plurality of bits constituting write data is less than a reference value; and
an inverter configured for inverting or non-inverting (inverting/non-inverting) the write data according to the check result of the detector,
wherein the detector generates an error detection signal based on whether or not the number of bits having the first state among a plurality of bits constituting read data is equal to or more than the reference value.

2. The memory controller of claim 1, wherein the detector enables a flag signal based on whether or not the number of bits having the first state among the plurality of bits constituting the write data is equal to or more than the reference value.

3. The memory controller of claim 2, wherein the inverter inverts the write data based on the enabled flag signal.

4. The memory controller of claim 1, further comprising an ECC (Error Correction Code) module configured for generating a parity bit to detect and correct (detect/correct) an error of the inverted and non-inverted (inverted/non-inverted) write data, and providing data of which an error is detected and corrected (detected/corrected) through the parity bit, as the read data.

5. A memory system comprising:
a memory device comprising a plurality of memory cells for storing data having a first or second state; and
a memory controller configured for writing or reading (writing/reading) a preset length of write or read (write/read) data to or from (to/from) the memory device,
wherein the memory controller inverts or non-inverts (inverts/non-inverts) the write data such that less than half of the inverted or non-inverted (inverted/non-inverted) data has the first state, and generates an error detection signal based on whether or not equal to or more than half of the read data has the first state.

6. The memory system of claim 5, wherein the memory controller comprises:
a detector configured for enabling a flag signal based on whether or not equal to or more than half of the write data has the first state; and
an inverter configured for inverting and non-inverting the write data based on an enablement and disablement of the flag signal, respectively.

7. The memory system of claim 6, wherein the detector generates the error detection signal based on whether or not equal to or more than half of the read data has the first state.

8. The memory system of claim 6, wherein flag information indicating whether the write data is inverted or non-inverted is stored in the memory device with the inverted or non-inverted data.

9. The memory system of claim 8, wherein the inverter inverts/non-inverts the read data based on the flag information, in response to the error detection signal, and outputs the inverted/non-inverted data to an outside.

10. The memory system of claim 6, wherein the memory controller further comprises an ECC (Error Correction Code) module configured for generating a parity bit to detect and correct (detect/correct) an error of the inverted/non-inverted data, and providing data of which an error is detected and corrected (detected/corrected) through the parity bit, as the read data.

11. The memory system of claim 5, wherein each memory cell includes a phase change material.

12. An operating method of a memory system, comprising:
   checking whether the number of bits having a first state among a plurality of bits constituting write data is less than a reference value;
   inverting or non-inverting the write data according to the check result;
   storing the inverted or non-inverted data with flag information in a memory device, the flag information indicating whether the write data is inverted or non-inverted; and
   generating an error detection signal based on whether or not the number of bits having the first state among a plurality of bits constituting read data obtained by reading the stored data is equal to or more than the reference value.

13. The operating method of claim 12, further comprising inverting or non-inverting (inverting/non-inverting) the read data based on the flag information, based on the error detection signal, and outputting the inverted or non-inverted (inverted/non-inverted) data to an outside.

14. The operating method of claim 12, wherein the checking of whether the number of bits having the first state is less than the reference value comprises:
   counting the number of bits having the first state;
   comparing the count value to the reference value; and
   enabling a flag signal based on whether or not the comparison result indicates that the count value is equal to or more than the reference value.

15. The operating method of claim 14, wherein the inverting/non-inverting of the write data comprises inverting and non-inverting the write data based on an enablement and disablement of the flag signal, respectively.

16. The operating method of claim 12, wherein the storing of the inverted or non-inverted data with the flag information comprises:
   generating parity information to detect and correct (detect/correct) an error of the inverted or non-inverted data; and
   storing the inverted or non-inverted data with the parity information in the memory device.

17. The operating method of claim 16, wherein data of which an error is detected and corrected (detected/corrected) through the parity information are provided as the read data.

18. The operation method of claim 12, wherein the memory device includes memory cells each comprising a phase change material.

* * * * *